United States Patent
Slaughter et al.

(10) Patent No.: US 10,146,601 B2
(45) Date of Patent: Dec. 4, 2018

(54) METHODS AND DEVICES FOR HEALING RESET ERRORS IN A MAGNETIC MEMORY

(71) Applicant: Everspin Technologies, Inc., Chandler, AZ (US)

(72) Inventors: Jon Slaughter, Tempe, AZ (US); Dimitri Houssameddine, Gilbert, AZ (US); Thomas Andre, Austin, TX (US); Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 197 days.

(21) Appl. No.: 14/297,386

(22) Filed: Jun. 5, 2014

(65) Prior Publication Data

US 2014/0372792 A1 Dec. 18, 2014

Related U.S. Application Data

(60) Provisional application No. 61/833,990, filed on Jun. 12, 2013.

(51) Int. Cl.
| | | |
|---|---|---|
| *G06F 11/00* | (2006.01) | |
| *G06F 11/07* | (2006.01) | |
| *G11C 11/16* | (2006.01) | |

(52) U.S. Cl.
CPC ........ *G06F 11/073* (2013.01); *G11C 11/1673* (2013.01); *G11C 11/1675* (2013.01); *G11C 11/1677* (2013.01)

(58) Field of Classification Search
CPC ........................ G06F 11/073; G11C 11/1673; G11C 11/1677
See application file for complete search history.

(56) References Cited

U.S. PATENT DOCUMENTS

| | | | |
|---|---|---|---|
| 7,747,926 B2 | 6/2010 | Wise et al. | |
| 2011/0292714 A1 | 12/2011 | Andre et al. | |
| 2012/0195112 A1* | 8/2012 | Alam | G06F 11/1048 365/158 |
| 2012/0311396 A1 | 12/2012 | Andre et al. | |
| 2014/0269029 A1* | 9/2014 | Kinney | G11C 11/1673 365/158 |
| 2014/0372791 A1* | 12/2014 | Adachi | G06F 13/1689 714/5.1 |

FOREIGN PATENT DOCUMENTS

WO 2012106358 A1 8/2012

OTHER PUBLICATIONS

European Patent Office, Extended European Search Report for Application No. EP 14172241.3, dated Nov. 5, 2014.

* cited by examiner

*Primary Examiner* — Bryce P Bonzo
*Assistant Examiner* — Katherine Lin
(74) *Attorney, Agent, or Firm* — Bookoff McAndrews, PLLC (57) ABSTRACT

A method is provided for healing reset errors for a magnetic memory using destructive read with selective write-back, including for example, a self-referenced read of spin-torque bits in an MRAM. Memory cells are prepared for write back by one of identifying memory cells determined in error using an error correcting code and inverting the inversion bit for those memory cells determined in error; identifying memory cells determined in error using an error correcting code and resetting a portion of the memory cells to the first state; and resetting one or more memory cells to the first state.

20 Claims, 4 Drawing Sheets

METHODS AND DEVICES FOR HEALING RESET ERRORS IN A MAGNETIC MEMORY

CROSS REFERENCE TO RELATED APPLICATION

This application claims the benefit of U.S. Provisional Application No. 61/833,990 filed 12 Jun. 2013.

TECHNICAL FIELD

The exemplary embodiments described herein generally relate to magnetic memories using destructive read with selective write-back, and more particularly relate to methods for healing reset errors in a magnetoresistive random access memory (MRAM) having a spin-torque reset for a self-referenced read process.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM is an emerging memory technology with the potential for non-volatility with unlimited endurance and fast write speeds at much higher density than field-switched MRAM.

Data stored in memory is defined in pages within banks. A rank is a plurality of banks in a first direction (column) and a channel is a plurality of banks in a second direction (row). A process for accessing a page in the memory comprises several clock cycles required for bank, row, and column address identification as well as the transfer of data associated with a read or write operation. A high bandwidth data transfer may comprise accessing many thousands of bits of data associated with a range of address space across a page in one or more banks, ranks, or channels.

Access to a page within a bank in a memory generally includes an ACTIVATE operation, followed by several READ/WRITE operations and a PRECHARGE operation. The ACTIVATE operation opens a page associated with a specified row and bank address, thereby reading from an array of memory the state of each of the cells within the page, typically 1,000 or more bits of data. The READ/WRITE operation performs the transfer of data (reading or writing) associated with specified column addresses, e.g., 128 bits, in the open page. The PRECHARGE operation closes the page, thereby assuring that the final state of each of the cells within the page after the performed operations is stored in the array of memory and that the bank is ready to receive a subsequent ACTIVATE command.

During the ACTIVATE operation, a page of data is read from the memory array and stored in local data-store latches for subsequent READ and WRITE operations from and to the local data-store latches. The ACTIVATE operation can be initiated by an ACTIVATE command or any other command that performs the same operation. During a PRECHARGE operation, the data from local data-store latches are written back to the memory array, and as a result, that page is considered closed or not accessible without a new ACTIVATE operation. The PRECHARGE operation can be initiated by a PRECHARGE or AUTO-PRECHARGE command or any other command that performs the same operation. During the PRECHARGE operation in ST-MRAM, current pulses to write the MTJs corresponding to the open page would be applied to write-back the data from the local data-store latches to ST-MRAM array.

In an MRAM implementation using a reset operation during an ACTIVATE operation, such as designs with spin-torque reset for self-referenced read, all the bits in a page or word are reset to a predetermined state, for example, "low," with a reset write current as part of the self-referenced read operation within the ACTIVATE operation. When the page is closed during the PRECHARGE operation, the bits with a final state indicating that they need to have their state changed are set "high" with a set write current. If error correcting code (ECC) is applied to the data that is read from the bits during the self-referenced read operation, corrected data can be used in determining the final state, and thereby which bits are selectively set during the PRECHARGE operation, reducing or eliminating the accumulation of errors over several ACTIVATE/PRECHARGE cycles. However, a bit that does not reset during the self-referenced read operation will be left in the "high" state, and, since the failing bit did not change state, the result of a self-referenced read operation will incorrectly read the failing bit as being in the "low" state. If the final data state is a "low" for that bit, the circuit will not apply a set write pulse to it during the PRECHARGE operation, leaving an error written to that word. Restated, a reset error will not always be healed by ECC. Such an error would combine with other sources, such write-back errors and hard fails, increasing the chance of having more than the correctable number of bad bits per ECC word, e.g., more than one bad bit per single-bit correction ECC word.

Accordingly, it is desirable to provide a method for healing reset errors for a self-referenced read of spin-torque bits in an MRAM. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for healing reset errors for a self-referenced read of spin-torque bits in an MRAM.

A first exemplary embodiment is a method of healing reset errors in a plurality of memory cells in a memory array, the method comprising performing a self-referenced read to identify one of a first state or a second state associated with each of the memory cells including resetting each of the memory cells to the first state; identifying by an error correcting code an error in at least one memory cell; performing an action on one or more memory cells, the action consisting of one of the group selected from selectively setting an inversion memory cell to the second state, determined at least in part by the result of the error correction operation; and resetting at least a portion of the memory cells to the first state; and selectively setting to the second state each of the respective memory cells determined to be associated therewith.

A second exemplary embodiment is a method of healing reset errors in a plurality of memory cells in a memory array, the method comprising performing a self-referenced read to identify one of a first state or a second state associated with each of the memory cells including resetting each of the memory cells to the first state; resetting at least a portion of the memory cells to the first state; and selectively setting to the second state each of the memory cells determined to be associated therewith.

A third exemplary embodiment is a memory device comprising a plurality of memory cells; and circuitry coupled to the memory cells and configured to perform a self-referenced read to identify one of a first state or a second state associated with each of the memory cells including resetting each of the memory cells to the first state; and perform an action to correct reset errors on one or more memory cells, the action consisting of one of the group selected from selectively set an inversion memory cell to the second state, determined at least in part by the result of an error correction operation; and reset at least a portion of the memory cells to the first state; and set to the second state each of the memory cells determined to be associated therewith.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The exemplary embodiments described herein perform an operation after the read is complete and before the write-back, which reduces the bit error rate of MRAM devices using a reset operation, especially for spin-torque reset since selected bits may be reset. The embodiments may allow for the use of shorter reset pulses, or lower power reset pulses, since the memory will be able to tolerate a higher reset error rate. In general, in a first exemplary embodiment, if an error bit detected by error correcting code (ECC) in the data in an ECC word was read as "low" and the final data to be written back is "low" for that bit, invert the data in that word or page by setting an inversion bit(s), thus making the data associated with that bit to be stored in the array "high". A second exemplary embodiment uses ECC information to identify an error condition and then performs a second reset operation on the ECC word or page containing the cell(s) determined in error. A third exemplary embodiment uses ECC information to identify an error condition and then performs a second reset operation only on the bits that the self-referenced read determined to be "low". A fourth exemplary embodiment uses ECC information to identify an error condition and then performs a second reset operation on all bits determined to be errors and that were corrected by ECC. A fifth exemplary embodiment uses ECC information to identify an error condition and then performs a second reset operation on all bits determined to be errors that were corrected by ECC and that the self-referenced read determined to be "low". A sixth exemplary embodiment, which may be applied to field-reset memory as well as spin-torque reset memory, performs a second reset operation for all bits in the page sometime during the cycle after read and before write-back. A seventh exemplary embodiment identifies memory cells that the self-referenced read determined to be "low" and performs a second reset operation on the memory cells that the self-referenced read determined to be "low".

The particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Furthermore, it should be noted that, while the current invention is described in the context of magnetoresistive memories, it could also be applied to other types of memories using a destructive read with selective write-back such as, but not limited to, charge based memories, resistive RAMs, phase change RAMs, etc.

For the sake of brevity, conventional techniques related to reading and programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided that the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance (MR) is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

Figure 1:
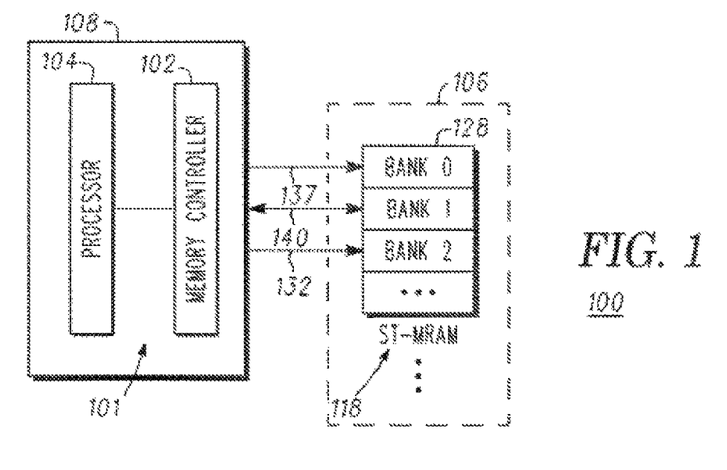
FIG. 1 is a block diagram of a memory interconnection system that may be used to apply the methods in accordance with the exemplary embodiments.

FIG. 1 is a block diagram of an exemplary memory system 100 including circuitry 101 comprising a memory controller 102 that performs data transfer between a processor 104 and the memory 106. The invention is not to be limited to this particular type of architecture. The memory controller 102 and the processor 104 may reside on the same chip 108, or they may reside on separate chips (not shown). The memory array 106 comprises a non-volatile memory 118 using magnetic tunnel junctions, preferably ST-MRAM, for data storage. The non-volatile memory 118 comprises a plurality of non-volatile memory banks 128.

A chip select (CS) line 132 provides a CS signal from the memory controller 102 to the non-volatile memory 118. An address bus 137 and a data line 140 couples the memory controller 102 to the non-volatile memory 118. Other control and clock signals may exist between the memory controller 102 and non-volatile memory 118 that are not shown in FIG. 1. Furthermore, an address bus 137 and a data line 140 may include multiple lines or bits.

Figure 2:
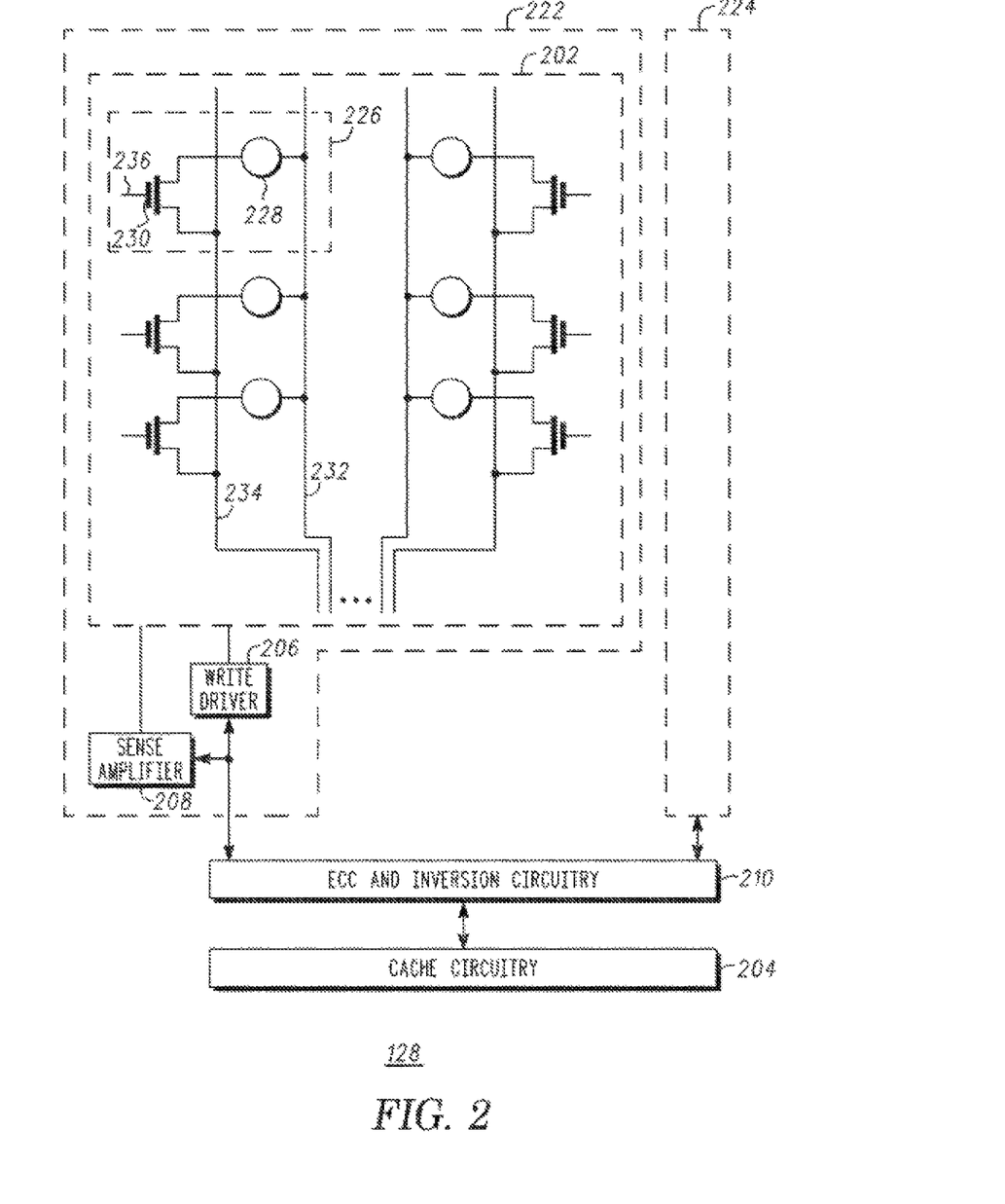
FIG. 2 is a partial schematic diagram of a ST-MRAM bank.

FIG. 2 is a partial schematic diagram of a ST-MRAM bank 128. A ST-MRAM bit cell array 202 is coupled to cache circuitry 204 by write driver 206, sense amplifier 208, and ECC and inversion circuitry 210. The write driver 206 operates in a known manner for writing data to the array 202 and the sense amplifier 208 operates in a known manner by reading data from the array 202. During a read operation, ECC and inversion circuitry 210 may correct and invert read data from sense amplifier 208 and provide resulting output data to cache circuitry 204. During a write operation, ECC and inversion circuitry 210 may correct and invert data from cache circuitry 204 and send to write driver 206 for writing to bit cell array 202. The cache circuitry 204 comprises multiple bits and is a part of the data path in a memory array. For simplicity and brevity, other known circuit blocks in a memory, such as a column multiplexer, a word line driver, row and column address decode circuit, that can be coupled between the bit cell array 202 and rest of the circuits in FIG. 2, are not shown in FIG. 2.

The ST-MRAM bank 128 includes a plurality of core strips 222, 224 with each core strip including a plurality of magnetic bit cells 226. Each magnetic bit cell 226 includes a magnetic tunnel junction device 228 and a word line select transistor 230. Within each core strip 222, 224 each magnetic bit 226 is coupled between a bit line 232 and a first electrode of a word line select transistor 230, while a second electrode of each word line select transistor 230 is coupled to a source line 234. A control electrode of each word line select transistor 230 is coupled to a voltage word line 236 (one of the voltage word lines 236 is coupled to a single select transistor (not shown) within each core strip 222, 224). In another embodiment, a portion of cache circuitry 204 and ECC and inversion circuitry 210 may be located inside the core strip 222.

In operation, an ACTIVATE operation for an address can be initiated in non-volatile memory 118. Subsequently, the memory controller 102 initiates READ or WRITE operations in the non-volatile memory 118. The data from non-volatile memory 118 is read after the non-volatile memory ACTIVATE operation is complete.

The ACTIVATE operation in double data rate (DDR) ST-MRAM performs a destructive read where read data in the memory array is reset to logic state "0" during the read process. In an MRAM implementation using local cache circuitry, the read data from the memory array is stored in the cache circuitry 204 at the completion of the ACTIVATE operation. READ/WRITE operations subsequent to the ACTIVATE operation are performed to the cache circuitry 204 instead of the ST-MRAM array 106. A small time interval, e.g. 5 nanoseconds, between READ/WRITE operations is feasible due to fast latch operations.

During the ACTIVATE operation, a page of data is read from the memory array 106 and stored in cache circuitry 204 for subsequent READ and WRITE operations from and to the cache circuitry 204. The ACTIVATE operation can be initiated by an ACTIVATE command or any other command that performs the same operation. During a PRECHARGE operation, the data from local cache circuitry 204 are written back to the memory array 106, and as a result, that page is considered closed or not accessible without a new ACTIVATE operation. The PRECHARGE operation can be initiated by a PRECHARGE or AUTO-PRECHARGE command or any other command that performs the same operation. During the PRECHARGE operation in ST-MRAM, current pulses to write the MTJs corresponding to the open page would be applied to write-back the data from the local data-store latches to ST-MRAM array.

In an MRAM implementation using a reset operation, such as designs with spin-torque reset for self-referenced read, wherein all the bits in a page or word in the memory array 106 are reset to a predetermined state, for example, "low," with a reset write current during a self-referenced read of each memory cell.

Figure 3:
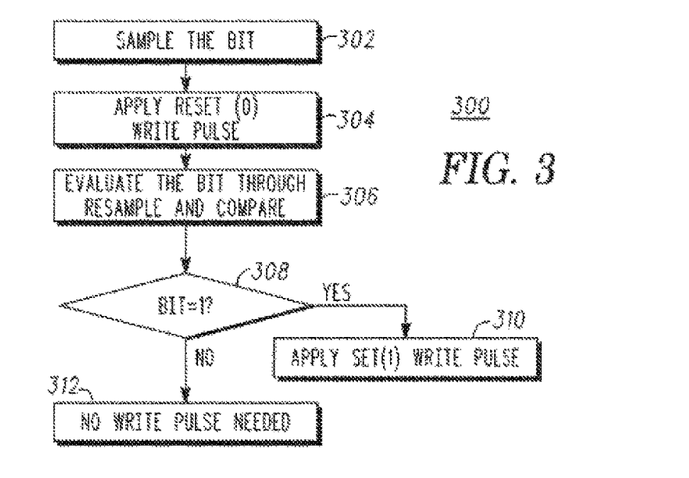
FIG. 3 is a flow chart of known steps for reading, resetting, and writing bits.

FIG. 3 is a flow chart that illustrates an exemplary embodiment of a destructive read operation with an immediate write-back process 300 for restoring read bits of a ST-MRAM memory back to their state prior to the destructive read. For illustrative purposes, the following description of process 300 may refer to elements mentioned above in connection with FIG. 1 and FIG. 2. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein. Moreover, one or more of the tasks shown in FIG. 3 could be omitted from an embodiment of the process 300 as long as the intended overall functionality remains intact.

This example of destructive read with immediate write-back in the ST-MRAM array includes first sampling 302 a magnetic bit of the non-volatile memory 118 to provide and store a sampled voltage. An exemplary sample operation is applying a desired bit voltage across a bit; converting the resulting current through the bit into a sample voltage, and storing the sample voltage into a capacitor. A reset write current pulse is applied 304 to set the bit to 0 (equivalent to a logic state "0"). The bit state is evaluated 306 by resampling a voltage after step 304 is complete and comparing the resampled voltage with the sampled voltage from step 302. An exemplary resample and evaluate operation is applying the same desired bit voltage from step 302 across the bit; comparing the resulting current through the bit added with an offset current with the current due to the sample voltage from step 302 to generate an evaluation voltage, and comparing the evaluation voltage with the sample voltage from step 302 to evaluate the bit state. The bit state is thus determined to be either 0 or 1 depending on the sampled voltage levels from 302 and 306. For example, if sampled voltage from 306 is higher than that from step 302, the bit state is 0. The sampled voltage levels can be compared in multiple ways to resolve the bit state. If 308 the bit state is 1, a set write current pulse is applied 310 to set the bit to 1, thus performing an immediate write-back to restore the bit state. If 308 the bit state is not 1, no write pulse is needed 312. While not shown in FIG. 3, an alternate embodiment may apply a set write pulse in step 304 and apply a reset write pulse in step 310.

Figure 4:
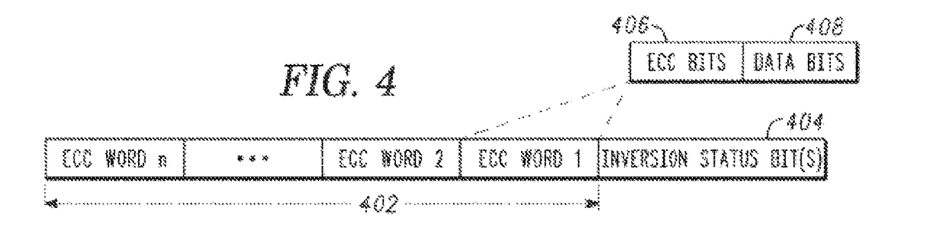
FIG. 4 is a known organization of words in a row/page of a bank of non-volatile memory.

Referring to FIG. 4, a method of organizing a page of bits into multiple error correcting code (ECC) words, for some of the exemplary embodiments described herein, includes a plurality of ECC words 402 from 1 to n and a word of inversion status bits 404. Each ECC word 402 comprises a plurality of ECC bits 406 and a plurality of data bits 408. In accordance with the present exemplary embodiment, set or reset write current pulses for one ECC word or a group of ECC words can be executed, e.g., initiate, complete, and abort functions, independently at any time. A write clock phase generator coupled to one ECC word or a group of ECC words is used for independent execution of write current pulses. Therefore, a page of bits will be coupled to separate clock phase generators. When a WRITE operation subsequent to an ACTIVATE operation or any other operation provides data for a portion of the bits in page, the portion of the bits will correspond to either one ECC word or multiple ECC words.

To minimize power consumption during writes to memory array, a majority detection and data state inversion scheme can be employed. According to a majority detection scheme, a majority state of the data or data and ECC is determined to be a first or second state. Either one of the first or second state may consume more power to write to the memory. If the majority state is determined to be the more power consuming state, all the data bit states or data and ECC bit states may be inverted to the opposite state and written back to the memory. Inversion status bits indicate if the data or data and ECC in a page are inverted or not.

When the page is closed during PRECHARGE, the bits that need to have their state changed are pulsed "high" with a write current. If ECC is applied to the data that is read from the magnetic bits, and the corrected data written back, normal write errors do not accumulate in the cycle. A bit that does not reset during the self-referenced read operation will be left in the "high" state, and, since the failing bit did not change state, the result of a self-referenced read operation will incorrectly read the failing bit as being in the "low" state. Furthermore, if the final data state is a "low" for that bit, the circuit will not apply a set write pulse to it during the PRECHARGE operation, leaving an error written to that word. Restated, a reset error will not always be healed by ECC. Such an error would combine with other sources, such write-back errors and hard fails, increasing the chance of having more than the correctable number of bad bits per ECC word, e.g., more than one bad bit per single-bit correction ECC word.

The healing of reset errors may be accomplished in one of several exemplary embodiments. Each of the exemplary embodiments described herein reduces the bit error rate of MRAM devices, and, in a first embodiment, extra pulses are not added to the read/write cycle to create a negative impact on timing.

A first exemplary embodiment identifies memory cells in error using an error correcting code and sets the inversion bit(s) for the ECC word or page containing the cell(s) determined in error. If an error bit detected by ECC in the data in an ECC word was read as "low" and the final data to be written back is "low" for that bit, invert the data in that word or page by setting an inversion bit(s), thus making the data associated with that bit to be stored in the array "high". Since the error bit would already be "high" if it was caused by a reset error, it will no longer be an error after the write-back.

A second exemplary embodiment identifies memory cells in error using an error correcting code and performs a second reset operation on the ECC word or page containing the cell(s) determined in error. In the case where the error was caused by failure to reset a bit to the "low" state, the error might be corrected by the second reset pulse.

In a third exemplary embodiment, memory cells determined in error are identified using an error correcting code and a second reset operation is performed on bits that the self-referenced read determined to be "low". In the case where an error bit was read as "low" because the bit did not change state during the first reset operation, the error might be corrected by the second reset pulse.

In a fourth exemplary embodiment, memory cells determined in error are identified using an error correcting code and a second reset operation is performed on all bits in error.

In a fifth exemplary embodiment, memory cells determined in error are identified using an error correcting code and a second reset operation is performed on all bits in error that the self-referenced read determined to be "low".

It is preferable to apply the second reset pulse immediately after the data has been read from the memory cells and stored to the latches since it will have less impact on the cycle time. However, in the case where the second reset pulse is part of the write-back operation, it is possible to apply the reset pulse only to the bits in error for which the final data to be written back is "low".

A sixth exemplary embodiment performs a second reset operation for all bits in a page sometime during the cycle after the read and before the write-back. All of the bits may be reset, which works for field-reset MRAM as well as spin torque MRAM reset approaches.

A seventh exemplary embodiment identifies memory cells that the self-referenced read determined to be "low" and performs a second reset operation on the memory cells that the self-referenced read determined to be "low".

The second reset pulse can vary in duration, amplitude and shape from the first reset pulse. For example, it can be made shorter or have a lower amplitude than the first pulse since it is intended to correct a low level of reset errors.

A shorter or lower amplitude second reset pulse is preferable in the case of the sixth and seventh embodiments to minimize the impact on power consumption. For the other embodiments, the second reset pulse occurs only when an error is detected and its impact on power consumption should be negligible.

Figure 5:
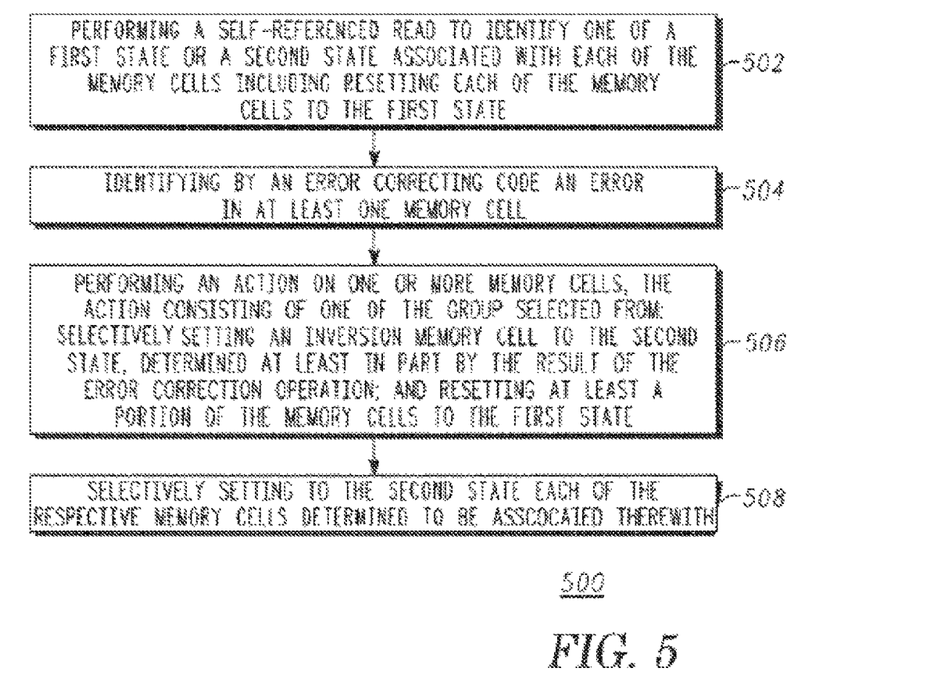
FIG. 5 is a flow chart of the steps for reading a self-referencing sense amplifier in accordance with an exemplary embodiment.
Figure 6:
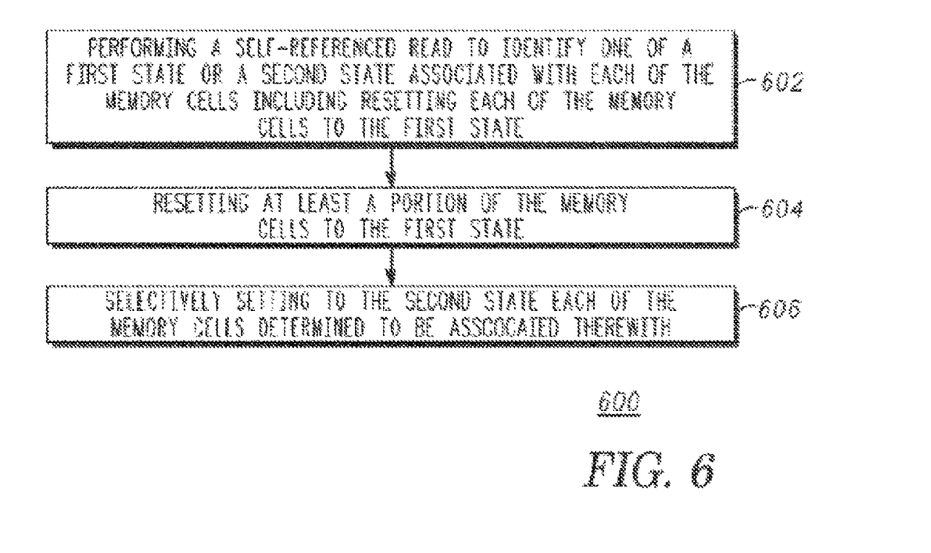
FIG. 6 is a flow chart of the steps for reading a self-referencing sense amplifier in accordance with another exemplary embodiment.

FIGS. 5 and 6 are flow charts that illustrate exemplary embodiments of methods 500 and 600, respectively. The various tasks performed in connection with methods 500 and 600 may be performed by software, hardware, firmware, or any combination thereof. For illustrative purposes, the following description of methods 500 and 600 may refer to elements mentioned above in connection with other FIGS. In practice, portions of methods 500 and 600 may be performed by different elements of the described system. It should be appreciated that methods 500 and 600 may include any number of additional or alternative tasks, the tasks shown in FIGS. 5 and 6 need not be performed in the illustrated order, and methods 500 and 600 may be incorporated into a more comprehensive procedure or process having additional functionality not described in detail herein. Moreover, one or more of the tasks shown in FIGS. 5 and 6 could be omitted from an embodiment of the methods 500 and 600 as long as the intended overall functionality remains intact.

The flow chart of FIG. 5 describes a method 500 of healing reset errors in a plurality of memory cells in a magnetoresistive memory array, the method comprising performing 502 a self-referenced read to identify one of a first state or a second state associated with each of the memory cells including resetting each of the memory cells to the first state; identifying 504 by an error correcting code an error in at least one memory cell; performing 506 an action on one or more memory cells, the action consisting of one of the group selected from selectively setting an inversion memory cell to the second state, determined at least in part by the result of the error correction operation; and resetting at least a portion of the memory cells to the first state; and writing 508 the state back to each of the respective memory cells.

The flow chart of FIG. 6 describes a method 600 of healing reset errors in a plurality of memory cells in a magnetoresistive memory array, the method comprising performing 602 a self-referenced read to identify one of a first state or a second state associated with each of the memory cells including resetting each of the memory cells to the first state; resetting 604 at least a portion of the memory cells to the first state; and writing 606 the second state associated therewith back to each of the memory cells.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of reading from and writing to a plurality of magnetoresistive memory cells, the method comprising:
    identifying a data storage state of each magnetoresistive memory cell of the plurality of magnetoresistive memory cells, wherein each magnetoresistive memory cell is configured to store data in one of a first data storage state or a second data storage state;
    storing the identified data storage state of each magnetoresistive memory cell into a cache;
    determining, using an error correcting code, whether the identified data storage state of at least one magnetoresistive memory cell of the plurality of magnetoresistive memory cells includes an error; and
    storing data from the cache into the plurality of magnetoresistive memory cells, wherein storing includes storing an inverted state of the data, if the identified data storage state of the at least one magnetoresistive memory cell includes an error based on the determination using the error correcting code.

2. The method of claim 1, further comprising:
    setting at least one inversion bit to indicate that the data stored in the plurality of magnetoresistive memory cells is inverted, if the identified data storage state of the at least one magnetoresistive memory cell includes an error based on the determination using the error correcting code.

3. The method of claim 1, wherein the first data storage state is a "high" state, and the second data storage state is a "low" state.

4. The method of claim 1, further comprising inverting a state of the data if the identified data storage state of the at least one magnetoresistive memory cell includes an error based on the determination using the error correcting code, and wherein inverting the state of the data is performed despite a determination of a majority data storage state for the plurality of magnetoresistive memory cells.

5. The method of claim 1, wherein the data includes one or more of data and error correcting code (ECC) words.

6. The method of claim 1, wherein the data includes an error correcting code (ECC) word, and wherein the ECC word includes at least one data bit and at least one ECC bit.

7. The method of claim 1, further comprising inverting a state of the data if the identified data storage state of the at least one magnetoresistive memory cell includes an error based on the determination using the error correcting code, and wherein inverting the state of the data overrides majority detection used to write back a minimum number of bits.

8. The method of claim 1, wherein each magnetoresistive memory cell includes a spin-torque magnetoresistive memory element.

9. The method of claim 1, wherein identifying the data storage state of each magnetoresistive memory cell includes performing a self-referenced read of the plurality of magnetoresistive memory cells.

10. The method of claim 9, wherein an ACTIVATE commands initiates the performance of the self-referenced read of the plurality of magnetoresistive memory cells.

11. A method of reading from and writing to a plurality of magnetoresistive memory cells, the method comprising:
    identifying a data storage state of each magnetoresistive memory cell of the plurality of magnetoresistive memory cells, wherein each magnetoresistive memory cell is configured to store data in one of a first data storage state or a second data storage state;
    storing the identified data storage state of each magnetoresistive memory cell into a cache;
    determining, using an error correcting code, whether the identified data storage state of at least one magnetoresistive memory cell of the plurality of magnetoresistive memory cells is different than an expected data storage state for the at least one magnetoresistive memory cell;
    storing data from the cache into the plurality of magnetoresistive memory cells, wherein storing includes storing an inverted state of the data, if the identified data storage state of the at least one magnetoresistive memory cell is different than the expected data storage state for the at least one magnetoresistive memory cell; and
    setting at least one inversion bit to indicate that the data stored in the plurality of magnetoresistive memory cells is in the inverted state, if the identified data storage state of the at least one magnetoresistive memory cell is different than the expected data storage state for the at least one magnetoresistive memory cell.

12. The method of claim 11, wherein the first data storage state is a "high" state, and the second data storage state is a "low" state.

13. The method of claim 11, further comprising inverting a state of the data if the identified data storage state of the at least one magnetoresistive memory cell is different than the expected data storage state for the at least one magnetoresistive memory cell, and wherein inverting the state of the data is performed despite a determination of a majority data storage state for the plurality of magnetoresistive memory cells.

14. The method of claim 11, wherein the data includes one or more of data and error correcting code (ECC) words.

15. The method of claim 11, wherein the data includes an error correcting code (ECC) word, and wherein the ECC word includes at least one data bit and at least one ECC bit.

16. The method of claim 11, further comprising inverting a state of the data if the identified data storage state of the at least one magnetoresistive memory cell is different than the expected data storage state for the at least one magnetoresistive memory cell, and wherein inverting the state of the data overrides majority detection used to write back a minimum number of bits.

17. The method of claim 11, wherein each magnetoresistive memory cell includes a spin-torque magnetoresistive memory element.

18. A memory device comprising:
a plurality of magnetoresistive memory cells, wherein each magnetoresistive memory cell is configured to store data in one of a first data storage state or a second data storage state; and
circuitry coupled to the plurality of magnetoresistive memory cells and configured to:
   identify a data storage state of each magnetoresistive memory cell of the plurality of magnetoresistive memory cells;
   store the identified data storage state of each magnetoresistive memory cell into a cache;
   determine a majority data storage state for the plurality of magnetoresistive memory cells;
   determine, using an error correcting code, whether the identified data storage state of at least one magnetoresistive memory cell of the plurality of magnetoresistive memory cells includes an error;
   invert a state of data retrieved from or stored in the cache if the identified data storage state of at least one magnetoresistive memory cell of the plurality of magnetoresistive memory cells includes an error based on the determination made using the error correcting code; and
   store the inverted data state in the plurality of magnetoresistive memory cells.

19. The memory device of claim 18, wherein the circuitry is configured to invert the state of data based on only one of:
(i) the determination of the majority data storage state for the plurality of magnetoresistive memory cells; or
(ii) the determination that the identified data storage state of the at least one magnetoresistive memory cell includes an error.

20. The memory device of claim 18, wherein the circuitry is configured to invert the state of data despite a determination of a majority data storage state for the plurality of magnetoresistive memory cells.

* * * * *